(12) United States Patent
Lee et al.

(10) Patent No.: US 11,158,611 B2
(45) Date of Patent: Oct. 26, 2021

(54) LED FILAMENT

(71) Applicant: OSRAM OLED GmbH, Regensburg (DE)

(72) Inventors: Ee Lian Lee, Balik Pulau (MY); Tilman Eckert, Regensburg (DE); Ralph Bertram, Herzogenrath (DE); Kok Eng Ng, Penang (MY); Anuarul Ikhwan Mat Nazri, Penang (MY)

(73) Assignee: OSRAM OLED GMBH, Regensburg (DE)

( * ) Notice: Subject to any disclaimer, the term of this patent is extended or adjusted under 35 U.S.C. 154(b) by 23 days.

(21) Appl. No.: 16/620,693

(22) PCT Filed: Jun. 8, 2018

(86) PCT No.: PCT/EP2018/000300
§ 371 (c)(1),
(2) Date: Dec. 9, 2019

(87) PCT Pub. No.: WO2018/224183
PCT Pub. Date: Dec. 13, 2018

(65) Prior Publication Data
US 2020/0105724 A1    Apr. 2, 2020

(30) Foreign Application Priority Data

Jun. 8, 2017   (DE) .......................... 102017112642.2

(51) Int. Cl.
*H01L 25/075*    (2006.01)
*H01L 21/66*     (2006.01)
(Continued)

(52) U.S. Cl.
CPC .......... *H01L 25/0753* (2013.01); *H01L 22/12* (2013.01); *H01L 33/504* (2013.01);
(Continued)

(58) Field of Classification Search
CPC ... H01L 25/0753; H01L 22/12; H01L 33/504; H01L 33/508; H01L 33/62;
(Continued)

(56) References Cited

U.S. PATENT DOCUMENTS 7,102,213 B2 * 9/2006  Sorg .................... H01L 31/0203
                                                      257/667
7,811,946 B2 * 10/2010 Izuno .................... H01L 33/505
                                                      438/778
(Continued)

FOREIGN PATENT DOCUMENTS

CN     102980054 A    3/2013
CN     203895450 U   10/2014
(Continued)

*Primary Examiner* — Vu A Vu
(74) *Attorney, Agent, or Firm* — Slater Matsil, LLP

(57) ABSTRACT

An LED filament is disclosed. In an embodiment an LED filament includes a carrier composed of a material transparent to electromagnetic radiation, two electrical terminals located on the carrier and at least two radiation-emitting semiconductor chips arranged on the carrier, wherein the semiconductor chips are electrically connected to the electrical terminals, wherein undersides of the semiconductor chips are connected by way of an adhesive layer to the carrier, wherein the adhesive layers comprise a first conversion material, wherein the first conversion material is configured to shift at least a portion of a wavelength of radiation from the semiconductor chips, wherein the semiconductor chips comprise a conversion layer on upper sides and on lateral areas, wherein the conversion layers are configured to shift at least a portion of the wavelength of the radiation from the semiconductor chips, wherein a transparent matrix material mixed with a second conversion material covers the semiconductor chips, and wherein sedimented conversion
(Continued)

layers with an increased concentration of the second conversion material cover the upper sides and lateral areas of the semiconductor chips.

17 Claims, 7 Drawing Sheets

(51) Int. Cl.
*H01L 33/50* (2010.01)
*H01L 33/62* (2010.01)

(52) U.S. Cl.
CPC ............ *H01L 33/508* (2013.01); *H01L 33/62* (2013.01); *H01L 2933/0041* (2013.01); *H01L 2933/0066* (2013.01)

(58) Field of Classification Search
CPC ..... H01L 2933/0041; H01L 2933/0066; H01L 33/505; F21K 9/232; F21Y 2103/10; F21Y 2115/10

USPC .......................................................... 257/88
See application file for complete search history.

(56) References Cited

U.S. PATENT DOCUMENTS

| | | | |
|---|---|---|---|
| 9,281,453 B2* | 3/2016 | Pindl | ...................... H01L 33/508 |
| 10,487,987 B2* | 11/2019 | Jiang | ........................ F21K 9/232 |
| 2015/0003039 A1 | 1/2015 | Liu et al. | |
| 2015/0097199 A1 | 4/2015 | Chen et al. | |
| 2015/0211723 A1* | 7/2015 | Athalye | ................... F21V 29/77 |
| | | | 362/294 |
| 2017/0084809 A1 | 3/2017 | Jiang et al. | |

FOREIGN PATENT DOCUMENTS

| | | |
|---|---|---|
| DE | 202011110805 U1 | 7/2016 |
| DE | 102015114849 A1 | 3/2017 |
| EP | 2911194 A1 | 8/2015 |
| WO | 2014114241 A1 | 7/2014 |

* cited by examiner

LED FILAMENT

This patent application is a national phase filing under section 371 of PCT/EP2018/000300, filed Jun. 8, 2018, which claims the priority of German patent application 102017112642.2, filed Jun. 8, 2017, each of which is incorporated herein by reference in its entirety.

TECHNICAL FIELD

The invention relates to an LED filament and to a process for the production of an LED filament.

BACKGROUND

The prior art discloses production of LED filaments comprising light-emitting diodes to produce electromagnetic radiation.

SUMMARY OF THE INVENTION

Embodiments provide an improved LED filament and an improved process for the production of an LED filament.

According to embodiments an advantage of the LED filament proposed is that electromagnetic radiation with a desired wavelength spectrum is also emitted by way of an underside of the semiconductor chip through the transparent carrier. This is achieved in that the radiation-emitting semiconductor chip is connected by way of a transparent adhesive layer to the carrier, where the adhesive layer comprises a conversion material. The conversion material of the adhesive layer is configured to shift, i.e., to convert, at least to some extent, the radiation from the semiconductor chip to the desired wavelength. The semiconductor chips moreover comprise a conversion layer on an upper side, where the conversion layer is likewise configured to shift at least a portion of the wavelength of the radiation from the semiconductor chip. The semiconductor chips are arranged on a carrier which is configured to be transparent to the radiation from the semiconductor chips. The carrier is also transparent to the radiation of which the wavelength has been shifted with the aid of the conversion layer. Because the conversion material is also arranged on the underside of the semiconductor chip, the overall effect is greater uniformity of emission of a preferably similar or identical wavelength spectrum across the upper side and the underside of the carrier. The semiconductor chips are in particular configured as light-emitting-diode chips.

Use of the adhesive layer with the conversion material moreover provides easy and rapid fixing and mounting of the semiconductor chips on the carrier. The adhesive layer with the conversion material can be applied on the carrier in a precise manner with a desired thickness and/or two-dimensional shape. The semiconductor chips are then connected to the carrier by simple placing onto the adhesive layer and hardening of the adhesive. For improvement of the adhesive connection, the semiconductor chips can be pressed onto the adhesive layer by a defined force during placing and also during the hardening of the adhesive.

In one embodiment, a transparent matrix material mixed with conversion material covers the semiconductor chips. The conversion material of the matrix material is arranged in the form of sedimented conversion layer on the upper sides and lateral areas of the semiconductor chips. The matrix material is transparent to the electromagnetic radiation emitted by the semiconductor chip and by the conversion layer. The semiconductor chips are protected from environmental effects with the aid of the matrix material. Use of the matrix material mixed with the conversion material moreover permits easy and inexpensive production of the LED filament. It is moreover possible, with the aid of the sedimentation procedure in which the conversion material arranged in the liquid or paste-like matrix material deposits in the form of conversion layer on the upper sides and lateral areas of the semiconductor chip, to achieve secure and reliable covering, by a conversion layer, of the upper sides and lateral areas of the semiconductor chip.

In some embodiments, in regions adjoining upper sides of the semiconductor chips the conversion layer, which comprises matrix material and conversion material, comprises a high concentration of conversion material which by way of example can be above 1 percent by volume of conversion material. In regions adjoining the upper sides of the semiconductor chip the concentration of the conversion material can also in particular comprise above 5 percent by volume. The concentration of the conversion material can decrease with increasing distance from the upper side of the semiconductor chip. In particular, at a prescribed distance from the upper side of the semiconductor chip the quantity of conversion material in the matrix material can decrease almost to zero, or precisely to zero. By way of example, outside of the conversion layer the matrix material can comprise a concentration below 1 percent by volume of conversion material. The thickness of the conversion layer with a high concentration of conversion material can be in the range below 0.3 mm.

In one embodiment, the carrier comprises receptacle regions, the receptacle regions being delimited by lateral areas and by a basal area. The semiconductor chips are arranged on the basal area. In some embodiments, there can be a receptacle region provided for each semiconductor chip. The arrangement of the semiconductor chips on the carrier can therefore be in receptacle regions separated from one another by partitions. By virtue of the receptacle regions with the partitions, a very modest layer of matrix material with conversion material can be sufficient to cover the semiconductor chips. The space which is provided here around each semiconductor chip and which requires filling with matrix material and conversion material in order to embed the semiconductor chip is only small. The receptacle regions moreover increase the mechanical stability of the carrier, while physical height is kept small.

In one embodiment, the partitions between two receptacle regions are configured to be lower than the side walls of the carrier. A coherent strip-shaped receptacle space, arranged above the receptacle regions, is thus configured along the longitudinal direction of the LED filament. It is thus possible to ensure that, when the transparent matrix material with the conversion material is introduced, if the fill level is above the height of the partitions all of the receptacle regions of the LED filament are filled. This permits rapid and inexpensive manufacture with, at the same time, secure covering of the semiconductor chips by the matrix material.

In another embodiment, the height of the partitions between two receptacle regions somewhat exceeds that of the upper side of the semiconductor chips. In this way it is possible to ensure sufficient protective covering of the semiconductor chips by matrix material and conversion material. Another consequence of modest height of the partitions between two receptacle regions is that little carrier material is configured between the receptacle regions. It is thus possible to reduce absorption of the electromagnetic radiation by the carrier material. The carrier material can absorb the electromagnetic radiation from the semiconductor chips to a greater extent than the matrix material. The expressions transparent matrix material and transparent carrier mean materials through which at least 50%, in particular at least 80%, of the electromagnetic radiation from the semiconductor chips, and of the electromagnetic radiation from the semiconductor chips with wavelength shifted by the conversion material, can pass.

In another embodiment, the lateral areas of the receptacle regions and the partitions incline outwardly. The receptacle regions therefore have a funnel shape in the direction of the basal area. A small area of adhesive material on the basal area can therefore be sufficient to connect the semiconductor chips securely to the carrier. Adhesive material is thus saved. By virtue of the small area it is moreover possible to achieve quicker and easier implementation of the procedure for the application of the adhesive material to the basal area.

Another advantage of the funnel-shaped configuration of the receptacle regions is that the inclined receptacle regions cause conversion material deposited in the matrix material to move in the direction toward the lateral area of the semiconductor chip. This can increase the probability that the lateral areas of the semiconductor chip become completely covered by conversion material.

Downward movement of the conversion material can lead to covering of an upper side of the semiconductor chip more easily than covering of the lateral areas of the semiconductor chip. With the aid of the outwardly oblique side walls and partitions it is possible in particular to cover lower edge regions of the lateral areas of the semiconductor chip, adjoining the basal area, reliably and with a sufficiently thick layer comprising a minimum concentration of conversion material. Uniform conversion of the electromagnetic radiation from the semiconductor chips is thus achieved for emission by way of the underside and also by way of the lateral areas, and also by way of the upper side. A homogeneous wavelength spectrum of electromagnetic radiation can thus be emitted by way of all sides of the carrier, i.e., of the LED filament.

In one embodiment, the semiconductor chips are connected in an electrically conductive manner by way of bonding wires to the electrical terminals of the carrier. Matrix material covers the bonding wires. The bonding wires are thus protected from environmental effects. A modest height of the partitions between two receptacle regions is advantageous in this embodiment, because the bonding wires can connect two adjacent semiconductor chips to one another without any requirement to bridge a high partition.

In one embodiment, the carrier is composed of a molding material. By way of example, silicone, plastic or epoxy can be used as molding material. Configuration of the carrier from a molding material permits relatively free design of the shape of the carrier. The molding material can moreover be mixed from various materials in accordance with the desired mechanical, optical and/or chemical properties. It is thus possible to achieve high flexibility and improved matching of the mechanical and optical properties of the carrier to desired properties of the LED filament.

In one embodiment, the electrical terminals are composed of metal strips connected to the carrier. In particular, the metal strips can have been embedded into the molding material of the carrier.

Homogeneous emission of electromagnetic radiation in particular through 360° in relation to the semiconductor chips is achieved in that the semiconductor chips emit the electromagnetic radiation in all directions and conversion material is provided in all directions.

The proposed process for the production of an LED filament provides the advantage that the LED filament can be produced simply and inexpensively. For this, a carrier with at least two electrical terminals is provided. An adhesive layer is applied to the carrier, at least in two sections. It is also possible in some embodiments that the two sections are configured coherently. The adhesive layer comprises a conversion material. The conversion material is configured to shift the wavelength of at least a portion of the electromagnetic radiation from the semiconductor chips. A semiconductor chip is respectively placed onto the adhesive layer in the two sections. It is also possible in some embodiments to place a plurality of semiconductor chips alongside one another in a section.

The carrier is composed of a material that is transparent to the electromagnetic radiation from the semiconductor chips and to the converted electromagnetic radiation. The undersides of the semiconductor chips are fixedly connected by way of the adhesive layer to the carrier. Since the adhesive layer is configured to comprise conversion material, the wavelength of the radiation emitted by way of the underside of the semiconductor chip is also shifted. The semiconductor chips are connected by way of electrical lines to the electrical terminals of the carrier. A matrix material comprising conversion material is then applied to the semiconductor chips. In a sedimentation procedure, the conversion material present in the matrix material deposits on the upper sides of the semiconductor chips. In essence, the upper sides and lateral areas of the semiconductor chips are covered by a conversion layer with a minimum concentration of conversion material. The minimum concentration can be at least 1% by volume, in particular 5% by volume, of the matrix material.

In one embodiment, the carrier is composed of a molding material. By way of example, silicone, plastic or epoxy can be used as molding material. The carrier is molded from molding material onto the electrical terminals. The use of molding material to configure the carrier permits relatively free selection of the shape of the carrier. The molding material can moreover be mixed from various materials in accordance with the desired mechanical, optical and/or chemical properties. It is thus possible to configure the carrier in an ideal manner for the prevailing requirements.

In one embodiment, the molding material is molded onto constituents of a leadframe. The constituents are then separated from the leadframe. In some embodiments it is also possible that, during the separation procedure a carrier is also separated from a molded carrier layer. It is thus possible to achieve rapidly and inexpensive mass production of the LED carriers.

In another embodiment, functionality of the LED filament between two constituents is checked before separation of the constituents from the leadframe. It is thus possible to separate, from the leadframe, only the carriers comprising viable semiconductor chips. Separation of an unviable LED filament is thus avoided. The procedure is thus simplified.

BRIEF DESCRIPTION OF THE DRAWINGS

The properties, features and advantages described above of this invention, and the manner of achieving same, are explained more clearly in the description below of the working examples; these are illustrated in more detail in the drawings.

DETAILED DESCRIPTION OF ILLUSTRATIVE EMBODIMENTS

Figure 1:
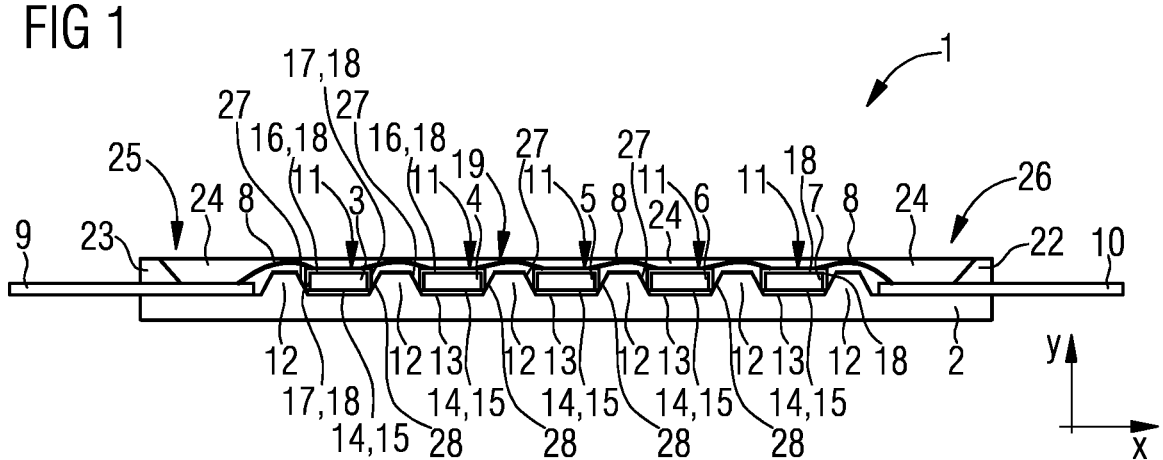
FIG. 1 is a diagrammatic longitudinal cross section through an LED filament.

FIG. 1 is a diagrammatic cross section through an LED filament 1 in longitudinal direction along an x-axis, where the LED filament 1 comprises a carrier 2. Five radiation-emitting semiconductor chips 3, 4, 5, 6, 7 are arranged on the carrier 2. The semiconductor chips 3, 4, 5, 6, 7 are connected to one another by way of electrical lines 8 electrically in series between two electrical terminals 9, 10 in series. The first semiconductor chip 3 here is connected in electrically conductive manner by way of an electrical line 8 to the first electrical terminal 9 of the carrier 2. The fifth semiconductor chip 7 is connected by way of an electrical line 8 to the second terminal 10 of the carrier 2. In the embodiment depicted, the electrical lines 8 are configured as bonding wires. The first and the second terminal 9, 10 are by way of example configured as metal strips, in particular metal pins. The semiconductor chips are in particular configured as light-emitting diode chips.

The carrier 2 is composed of a material permeable to electromagnetic radiation. By way of example, the carrier 2 can consist of a molding material such as silicone, plastic or epoxy. In the embodiment depicted, the electrical terminals 9, 10 have been embedded into the carrier 2. In the embodiment depicted, the shape of the carrier 2 is elongate, extending along an x-axis. The carrier 2 moreover comprises receptacle regions 11 to receive at least one semiconductor chip. Partitions 12 separate the receptacle regions 11 from one another. Each receptacle region 11 comprises a basal area 13. There is an adhesive layer 14 arranged on the basal area 13. Arranged on the adhesive layer 14 is in each case a semiconductor chip 3, 4, 5, 6, 7. The semiconductor chips have been fixed to the carrier 2 with the aid of the adhesive layer 14. The adhesive layer 14 is transparent to electromagnetic radiation. The adhesive layer 14 comprises conversion material 15. The conversion material 15 is configured to shift, at least to some extent, the wavelength of electromagnetic radiation from the semiconductor chips, i.e., to convert, at least to some extent, the wavelength of the electromagnetic radiation from the semiconductor chips to a different wavelength. The conversion material 15 can by way of example take the form of phosphor particles, for example made of YAG phosphor.

The area of the basal area 13 depends on the embodiment selected and is in essence the same as or somewhat greater than that of an underside of the semiconductor chips. By way of example, the size of the basal area 13 can be larger than the area of the underside of the semiconductor chips by up to 20%, in particular between 5 and 10%. The basal area 13 provided to receive the semiconductor chips 3, 4, 5, 6, 7 is thus minimized. The shape of the basal area 13 can be similar to or the same as that of the underside of the semiconductor chips 3, 4, 5, 6, 7. In particular, the basal area 13 can comprise a square or a rectangular area.

The thickness of the adhesive layer 14 is by way of example below 0.5 mm. A conversion layer 18 moreover covers an upper side 16 and lateral areas 17 of the semiconductor chips 3, 4, 5, 6, 7. The conversion layer 18 therefore covers all of the sides of the semiconductor chips 3, 4, 5, 6, 7 that are not in contact with the adhesive layer 14. Within the conversion layer 18, there is likewise conversion material 15 arranged. A conversion layer therefore covers the semiconductor chips 3, 4, 5, 6, 7 on all external areas except for the underside. The wavelength of electromagnetic radiation emitted in any direction from the semiconductor chip is thus at least to some extent shifted, i.e., converted, with the aid of the conversion material. In this way it is possible to produce good uniformity of the emitted wavelength spectrum, which is relatively homogeneous across all of the directions in which radiation is emitted.

Above the receptacle regions 11, there is an elongate strip-shaped receptacle space 19 configured, delimited by side walls 20 to 23 of the carrier 2. The receptacle space 19 is therefore configured to form a single entity with the receptacle regions 11 for the semiconductor chips 3, 4, 5, 6, 7. The height of the partitions 12 between adjacent receptacle regions 11 is smaller, along a y-axis, than that of the side walls 20 to 23. By way of example, the height of the partitions 12 can be arranged in the region of an upper side 16 of the semiconductor chips 3, 4, 5, 6, 7. The receptacle regions 11 and the receptacle space 19 comprise a matrix material 24 transparent to electromagnetic radiation. In the embodiment depicted, the matrix material 24 likewise covers the electrical lines 8. The lines are thus protected from environmental effects. The transparent matrix material comprises the conversion material 15, which has deposited in the form of sedimented conversion layer 18 on the upper side 16 and on the lateral areas 17. The conversion layer 18 therefore has an increased concentration of conversion material 15 in comparison with the other regions of the matrix material 24. By way of example, at least 1 percent by volume or at least 5 percent by volume of the conversion layer 18 can consist of conversion material 15. In some embodiments, it is also possible that more than 5 percent by volume of the conversion layer 18 consists of conversion material. The configured thickness of the conversion layer 18 can by way of example be in the region of 0.5 mm or less. It is also possible, when some sedimentation procedures are used, that conversion material 15 is also present in the region of the transparent matrix material 24, outside of the conversion layer 18, at lower concentration than in the conversion layer. By way of example, silicone, plastic or epoxy can be used as matrix material. The fill level of the matrix material 24 is at least above an upper side 16 of the partitions 12. It is thus possible, with the aid of a simple fill procedure in which matrix material is cast into the receptacle space 19, to achieve reliable filling of the receptacle regions 11.

At opposite ends of the carrier 2 there is in each case a contact cutout 25, 26 introduced into the carrier 2. The contact cutouts 25, 26 are likewise connected to the receptacle space 19, and are delimited by side walls and by a partition 12 of the carrier 2. In the embodiment depicted, the electrical terminals 9, 10 are configured as metal strips, in particular metal pins. The metal strips or metal pins are suitable for a welding procedure which can connect electrical lines to the contact strips. The terminals adjoin the contact cutouts 25, 26. It is thus possible to connect the semiconductor chips 3, 4, 5, 6, 7 by way of example with the aid of bonding wires 8 to the electrical terminals 9, 10 before the matrix material with the conversion material is introduced into the receptacle space 19.

A receptacle region 11 is delimited in the longitudinal direction by two opposite lateral areas 27, 28 of the partitions 12. In the example, the lateral areas 27, 28 are outwardly inclined. By way of example, the angle between the lateral areas 27, 28 and a plane of the basal area 13 can be between 10° and 90°.

Figure 2:
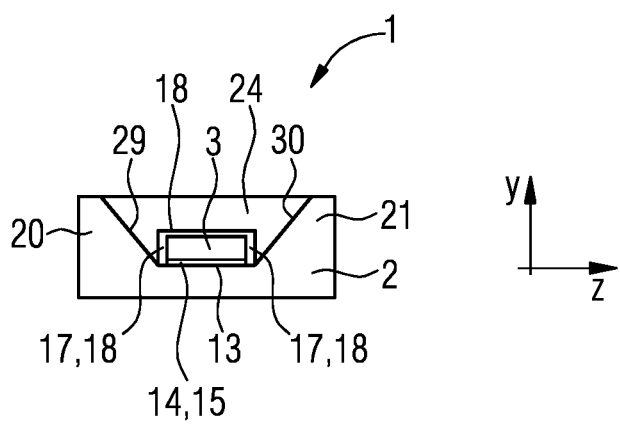
FIG. 2 is another cross section through the LED filament, perpendicularly to the longitudinal direction.

FIG. 2 is a diagrammatic cross section of the LED filament perpendicularly to the longitudinal direction, through a receptacle region 11 of the LED filament 1 of FIG. 1. The receptacle region 11 is delimited not only in longitudinal direction by the first and the second lateral area of the partitions but also in transverse direction by a third and fourth lateral area 29, 30 of the first and second side wall 20, 21. The third and fourth lateral area 29, 30 can also be outwardly inclined at an angle. By way of example, the third and fourth side wall 29, 30 are arranged at an angle between 10 and 90° in relation to a plane of the basal area 13. Along the transverse direction, i.e., the z-axis, the size of the basal area 13 is also preferably the same as, or somewhat larger than, the area of the underside of the semiconductor chips 3, 4, 5, 6, 7.

The arrangement of the outwardly inclined lateral areas 27, 28, 29, 30 achieves, in the direction of the basal area 13, a funnel-shaped configuration of the receptacle region 11. The funnel-shaped configuration of the receptacle region 11 has the advantage that the cross-sectional area decreases from an upper side toward the exterior side walls of the carrier 2 in the direction of the basal area 13. This funnel shape of the receptacle region 11 is advantageous for the sedimentation process in which deposition of the conversion material 15 takes place, where the matrix material 24, mixed with the conversion material 15, is introduced into the receptacle space 19 and the receptacle regions 11.

During the sedimentation procedure, the conversion material 15 moves downward by way of example by virtue of gravity or by virtue of centrifugal forces in the direction of the basal area 13. The upper sides 16 are covered here by the conversion layer 18. At the same time, when the conversion material 15 moves downward it is also, by virtue of the inclined lateral areas 27, 28, 29, 30 moved in the direction of the lateral areas 17 of the semiconductor chips, with increased concentration. It is thus also possible to achieve good covering of the lateral areas 17 with an increased concentration of conversion material in a lower region adjoining the basal area 13. The inclined lateral areas 27 to 30 therefore assist—generally difficult—covering of the lateral areas 17 of the semiconductor chips by the conversion material in a sedimentation procedure. It is thus possible, using a relatively low concentration of conversion material 15 in the matrix material 24, to produce a sufficiently thick conversion layer 18 and sufficiently high concentration of conversion material 15 on the upper sides and on the lateral areas 17 of the semiconductor chips 3, 4, 5, 6, 7.

Figure 3:
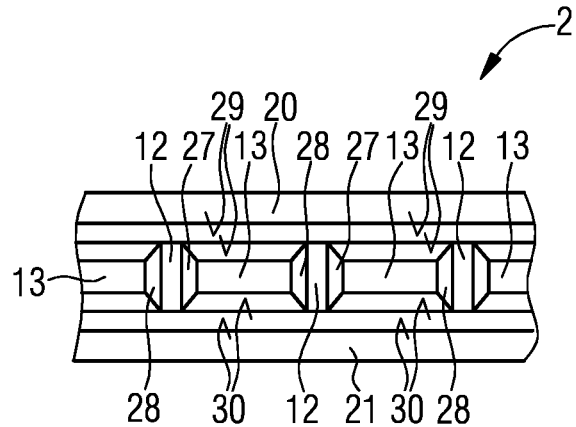
FIG. 3 is a plan view of a section of a carrier.

FIG. 3 is a detail of the carrier 2 in perspective view. This view clearly reveals the shape of the receptacle regions 11 and the shape of the receptacle space 19.

The basal areas 13 are delimited by the first, the second, the third and the fourth lateral area 27, 28, 29, 30. The first and the second lateral area 27, 28 are formed by the partitions 12. The third and the fourth lateral area 29, 30 are formed by the first and the second side wall 20, 21 of the carrier 2.

Figure 4:
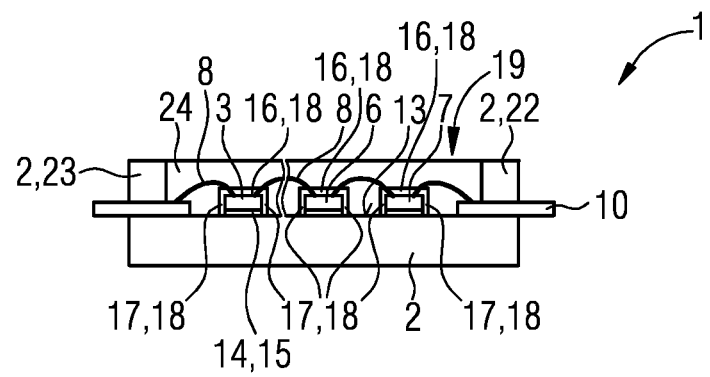
FIG. 4 is a diagrammatic longitudinal cross section through another embodiment of an LED filament.

FIG. 4 is a cross section through another embodiment of an LED filament 1 which in essence is configured according to the embodiment of FIG. 1 but in this embodiment without any partitions 12. The semiconductor chips 3, 6, 7 in this embodiment are arranged in a coherent receptacle space 19.

Figure 5:
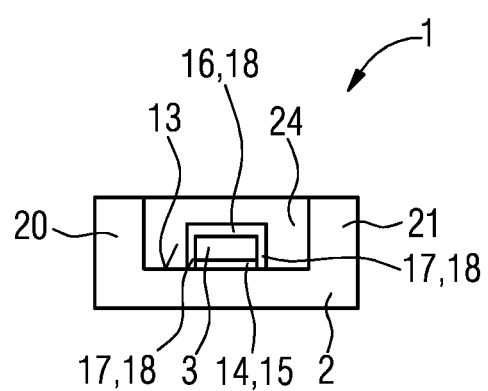
FIG. 5 is a diagrammatic cross section through the LED filament of FIG. 4, perpendicularly to the longitudinal direction.

FIG. 5 is a cross section perpendicular to the longitudinal direction of the LED filament 1 of FIG. 4. In this embodiment the partitions are absent. The third and the fourth lateral area 29, 30 of the first and second side wall 20, 21 can moreover also be configured perpendicularly to the plane of the basal area 13. Because the partitions 12 are absent, the basal area 13 is configured as unitary basal area for all of the semiconductor chips. In this embodiment the semiconductor chips 3, 4, 5 are also connected by way of an adhesive layer 14 with conversion material 15 to the basal area 13 of the carrier 2. A conversion layer 18 moreover covers the upper side 16 and the lateral areas 17 of the semiconductor chips 3. The carrier 2 is composed of a transparent material, as in the case of the embodiment of FIG. 1. A matrix material 24 moreover covers the semiconductor chips. This simple embodiment can also provide a homogeneous radiation spectrum from the semiconductor chips across all emission directions.

FIGS. 6 to 12 show steps of a process for the production of an LED filament according to FIG. 1.

Figure 6:
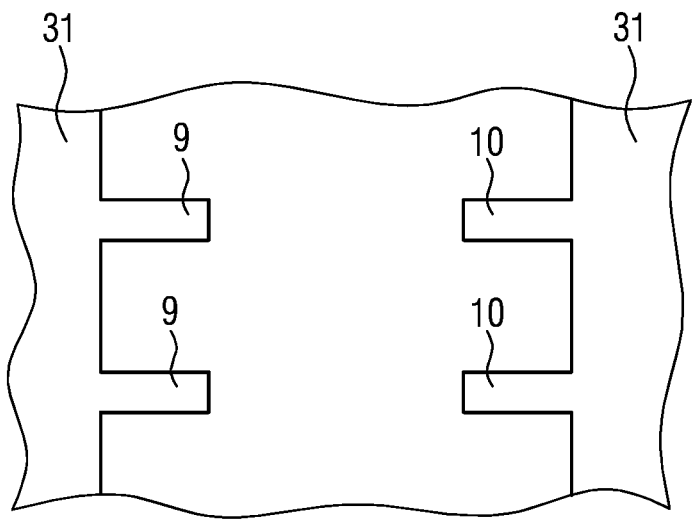
FIG. 6 is a detail of a leadframe.

FIG. 6 is a diagrammatic detail of a leadframe 31 which comprises a plurality of electrical terminals 9, 10 in the form of metal strips. In each case, the electrical terminals 9, 10 are in opposite pairs. The leadframe 31 has by way of example been die-cut from a thin copper sheet.

Figure 7:
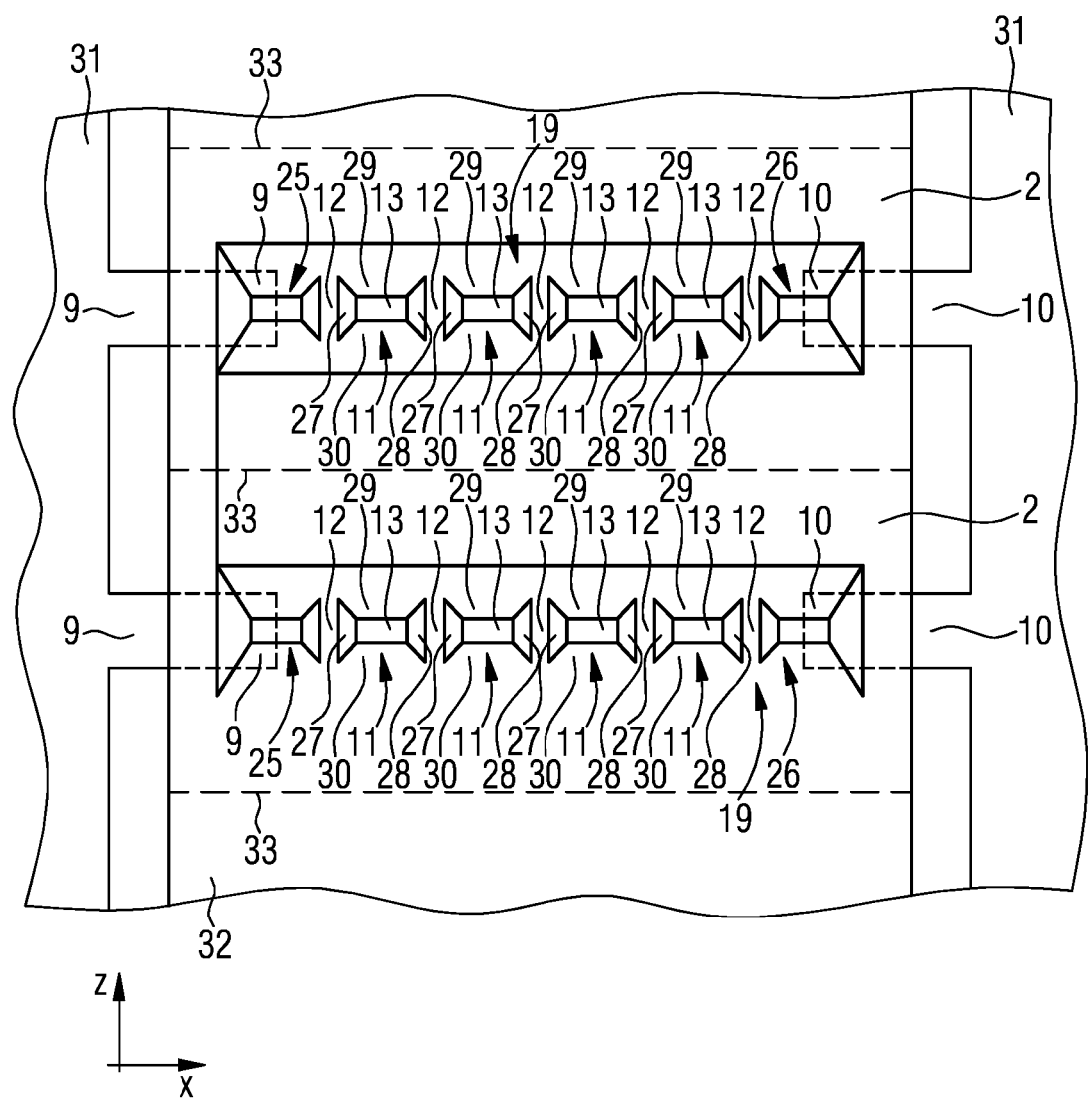
FIG. 7 shows molded onto the leadframe, a molding plate with cutouts for semiconductor chips.

In a process step that follows and is depicted in FIG. 7, a molding material in the form of a molding plate 32 is molded onto the electrical terminals 9, 10. There can be a plurality of pairs of electrical terminals 9, 10 connected to the molding plate 32. In some embodiments it is also possible to mold a plurality of molded bodies separate from one another, there being a pair of two opposite electrical terminals 9, 10 embedded into each molded body, as depicted diagrammatically by broken dividing lines 33. Outlines of the electrical terminals 9, 10 are depicted as broken lines in the regions where the molding material covers same.

The molding material for the molding plate 32 or the molded bodies consists by way of example of silicone, plastic or epoxy. The molding material is transparent to electromagnetic radiation, in particular to electromagnetic radiation from the radiation-emitting semiconductor chips and to the converted electromagnetic radiation from the semiconductor chips.

Configured in the molding plate 32, in each case between two opposite electrical terminals 9, 10, there is a strip-shaped receptacle space 19. The receptacle spaces 19 extend parallel to an x-axis. A receptacle space 19 is delimited by side walls 20, 21, 22, 23 made of molding material. Each receptacle space 19 moreover comprises a plurality of receptacle regions 11. Configured between each two receptacle regions 11 in the longitudinal direction of the receptacle space 19, there is a partition 12. Configured adjoining each of the electrical terminals 9, 10 there is moreover a contact cutout 25, 26 as part of the receptacle space 19.

Each of the receptacle regions 11 comprises a basal area 13. The basal areas 13 are delimited by inclined lateral areas 27, 28, 29, 30. The first and the second lateral area 27, 28 are respectively formed by a partition 12. The third and fourth lateral area 29, 30 are formed by lower parts of areas of a first and of a second side wall 20, 21. The first and the second electrical terminal 9, 10 are exposed in the region of the first and the second contact cutout 25, 26.

It is also possible to use, instead of the leadframe, individual electrical terminals 9, 10 embedded in molding material.

The molding process used can be any molding process, in particular by way of example an injection-molding process or a diecasting process. Molds provided here shape the molding plate 32 or the carriers 2 and the receptacle spaces 19 and the receptacle regions 11. In some embodiments it is also possible to use a foil-assisted molding process.

Figure 8:
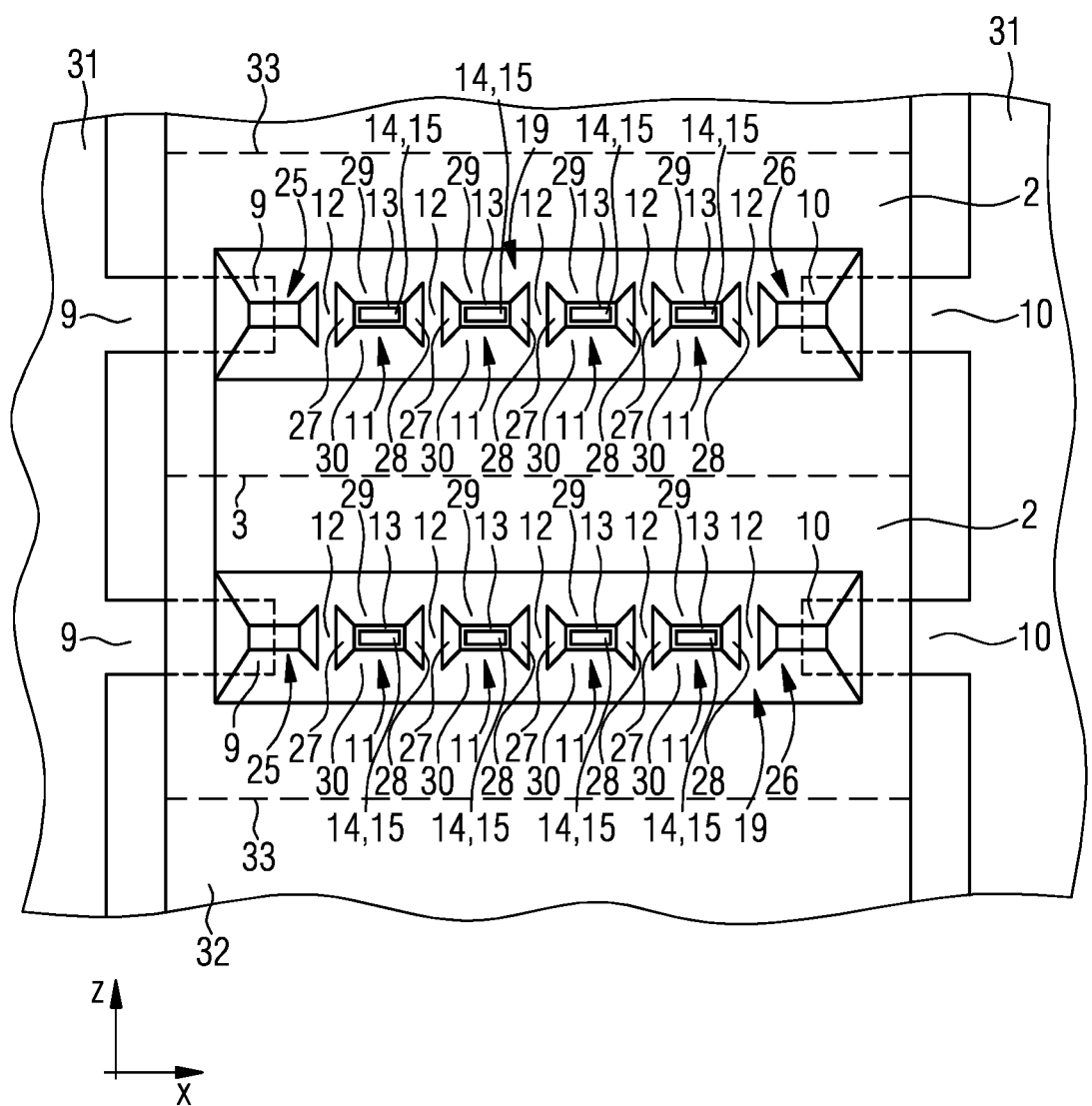
FIG. 8 shows the molding plate of FIG. 7 with semiconductor chips in place.

In a process step that follows and is depicted in FIG. 8, a transparent adhesive layer 14 with conversion material 15 is applied to each of the basal areas 13.

Figure 9:
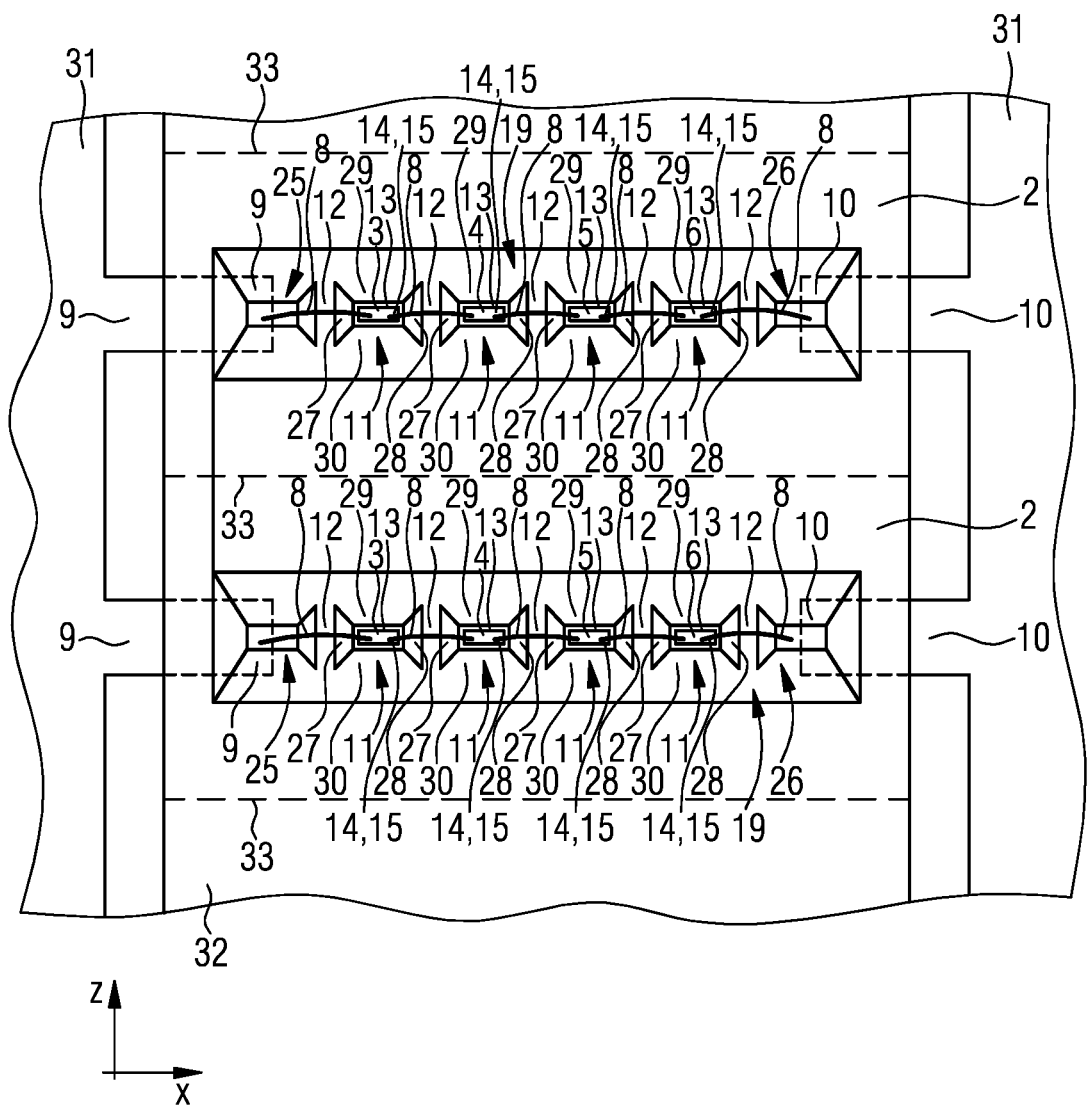
FIG. 9 shows the molding plate with semiconductor chips of FIG. 8 after electrical connection of the semiconductor chips.

As depicted in FIG. 9, a radiation-emitting semiconductor chip 3, 4, 5, 6 is then applied to each of the adhesive layers 14. The adhesive layers 14 are transparent to the electromagnetic radiation from the semiconductor chips, and the conversion material 15 here converts, at least to some extent, the wavelength of the electromagnetic radiation from the semiconductor chips to a different wavelength. The semiconductor chips are in particular light-emitting diode chips. The electrical semiconductor chips 3, 4, 5, 6 are then connected in electrically conductive manner by way of electrical lines 8 in the form of bonding wires to the electrical terminals 9, 10. In the embodiment depicted, the semiconductor chips are interconnected in series between the electrical terminals 9, 10. Some embodiments also permit serial and/or parallel electrical interconnection of the semiconductor chips 3, 4, 5, 6, 7 between the electrical terminals 9, 10.

Figure 10:
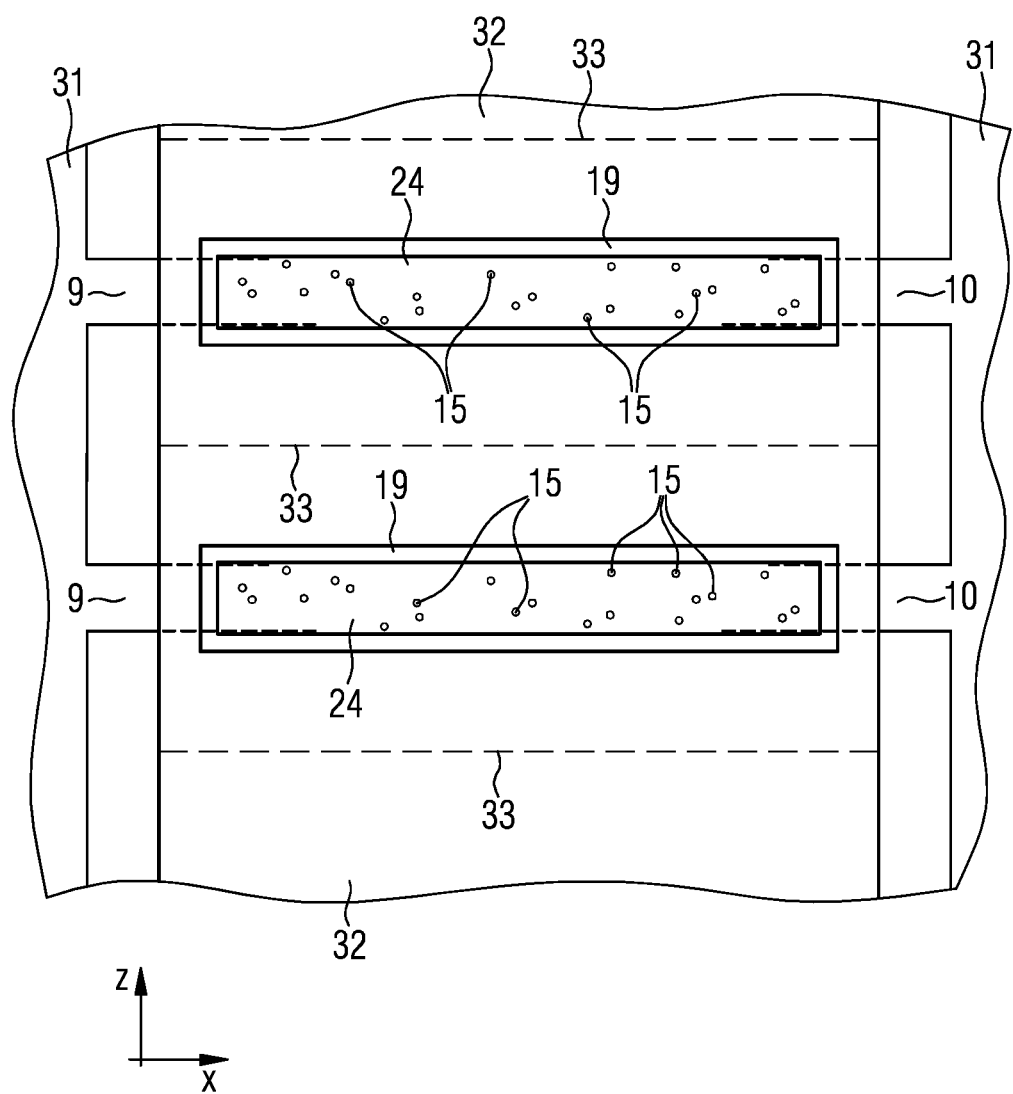
FIG. 10 shows the molding plate of FIG. 9, where a matrix material with conversion material has been introduced into the receptacle regions.

In a process step that follows and is diagrammatically depicted in FIG. 10, the receptacle regions 11 and the receptacle space 19 are filled with matrix material 24 mixed with conversion material 15. In this step the semiconductor chips, and preferably also the electrical lines 8, are covered by the matrix material.

Figure 11:
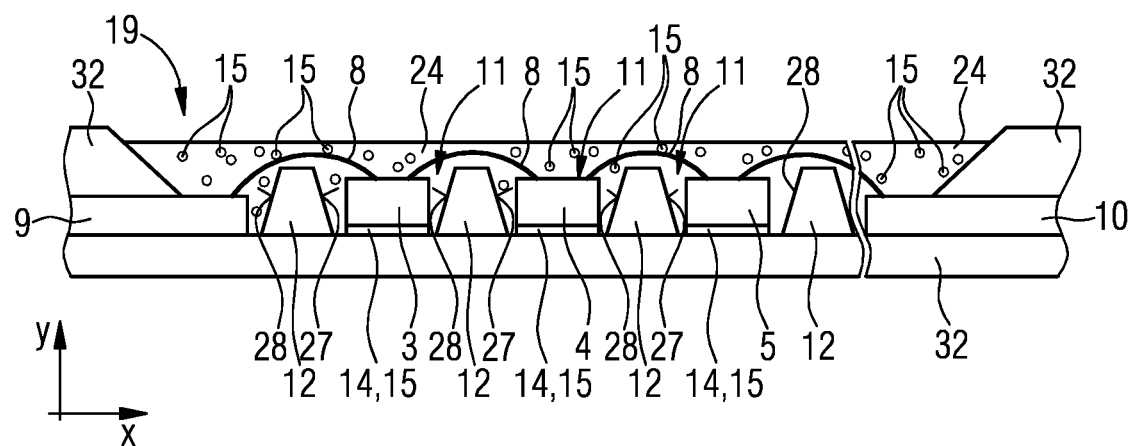
FIG. 11 is a cross section through the molding plate of FIG. 10 shortly after filling with matrix material.
Figure 12:
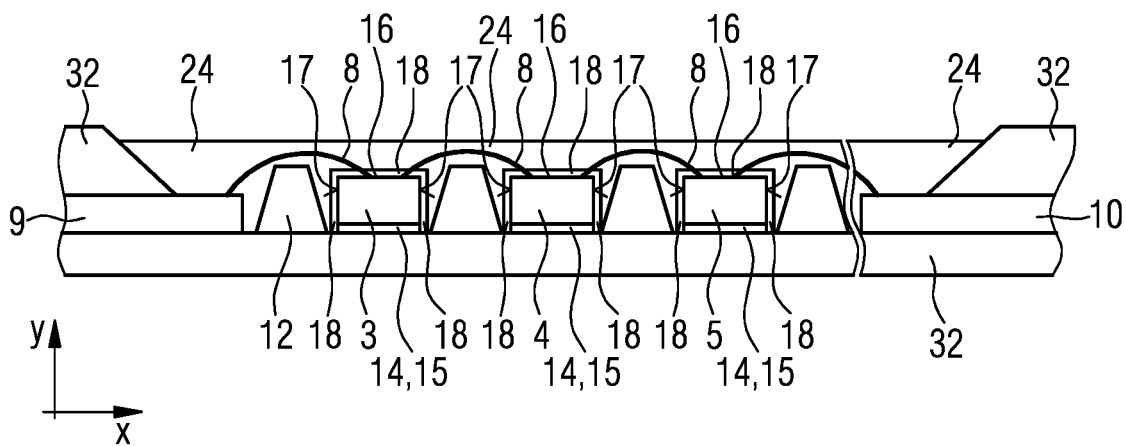
FIG. 12 is a cross section through the molding plate of FIG. 10 after deposition of the conversion material on the upper sides and lateral areas of the semiconductor chips.

FIG. 11 is a cross section through a receptacle space 19 of the arrangement of FIG. 10. Shortly after introduction of the matrix material 24, the conversion material 15 has been dispersed therein, as depicted diagrammatically in the form of dots. A sedimentation procedure then takes place in which the conversion material 15 moves downward in the direction of the basal area 13 of the carrier 2. This results in formation of a conversion layer 18 on the upper side 16 and on the lateral areas 17 of the semiconductor chips 3, 4, 5, as depicted in FIG. 12. The residual concentration of conversion material 15 provided in the matrix material 24 outside of the conversion layer 18 is small.

By way of example, the concentration of conversion material 15 outside of the conversion layer 18 is smaller than 10 percent by volume, in particular smaller than 5 percent by volume or smaller than 1 percent by volume. The sedimentation procedure is assisted by the inclined lateral areas 27, 28, 29, 30 of the receptacle regions 11. After a hardening time, the matrix material 24 hardens.

The electrical interconnection of the semiconductor chips 3, 4, 5 between two opposite electrical terminals 9, 10 can by way of example be tested before separation of the electrical terminals 9, 10 from the leadframe 31. If an arrangement of semiconductor chips is not viable, separation of the electrical terminals 9, 10 from the leadframe 31 can be omitted.

In a process step that follows, the electrical terminals 9, 10 are separated from the leadframe 31 and, if this has not already been done, individual carriers 2 are separated from the molding plate 32, as indicated by the dividing lines 33. Simple processes can thus be used to obtain an LED filament 1 according to FIG. 3.

The process steps of FIGS. 6 to 12 can also be used to produce an LED filament 1 of simple structure according to FIGS. 4 and 5.

In some embodiments, the matrix material, mixed with the conversion material, can by way of example be cast, injected, or otherwise introduced into the receptacle space. The electrical terminals 9, 10 can by way of example be separated from the leadframe 31 with the aid of a punching process. It is also analogously possible by way of example to divide the molding plate 32 into the individual carriers 2 with the aid of a punching process. In some embodiments it is also possible moreover that individual carriers 2 made of molding material are already formed, as depicted by the dividing lines 33 in FIG. 7, while the molding material is being molded onto the electrical terminals 9, 10 of the leadframe 31. Examples of materials that can be used for the conversion material 15 are barium magnesium aluminates doped with europium, cerium magnesium aluminates doped with terbium, lanthanum cerium phosphates doped with terbium and mixed yttrium europium oxides.

The invention has been illustrated and described with reference to the preferred embodiments. However, the invention is not restricted to the examples disclosed. Other variations can be derived from the above by the person skilled in the art within the scope of protection of the invention.

The invention claimed is:

1. An LED filament comprising:
   a carrier composed of a material transparent to electromagnetic radiation;
   two electrical terminals located on the carrier; and
   at least two radiation-emitting semiconductor chips arranged on the carrier,
   wherein the semiconductor chips are connected in electrically conductive manner to the electrical terminals,
   wherein the carrier comprises a receptacle space, the receptacle space being delimited by a basal area of the carrier, by a first side wall and a second opposite side wall of the carrier and by a third sidewall and a fourth opposite side wall of the carrier and by, wherein the side walls extend from the basal area in a y-direction,
   wherein a basal region of the carrier comprises a partition, the partition extending from the basal area of the carrier in the y-direction, wherein the partition extends from the first side wall to the second side wall of the carrier along a z-direction, wherein the partition divides the receptacle space along a x-axis in two receptacle regions, and wherein at least one of the semiconductor chips is arranged on the basal area of the carrier in each receptacle region,
   wherein undersides of the semiconductor chips are connected by way of an adhesive layer to the basal area of the carrier, wherein the adhesive layers comprise a first conversion material,
wherein the first conversion material is configured to shift at least a portion of a wavelength of radiation from the semiconductor chips,
wherein the semiconductor chips comprise conversion layers on upper sides and on lateral areas,
wherein the conversion layers are configured to shift at least a portion of the wavelength of the radiation from the semiconductor chips,
wherein a transparent matrix material mixed with a second conversion material covers the semiconductor chips, and
wherein sedimented conversion layers with an increased concentration of the second conversion material cover the upper sides and the lateral areas of the semiconductor chips.

2. The LED filament according to claim 1, wherein the partition terminates along the y-direction above heights of the upper sides of the semiconductor chips.

3. The LED filament according to claim 1, wherein the lateral areas of the receptacle regions incline outwardly.

4. The LED filament according to claim 1, wherein the semiconductor chips are connected by way of bonding wires in electrically conductive manner to one another and to the electrical terminals, and wherein the matrix material covers the bonding wires and the partition.

5. The LED filament according to claim 1, wherein the carrier with the side walls and the partition is composed of a molding material.

6. The LED filament according to claim 1, wherein the electrical terminals are composed of metal strips embedded into the carrier.

7. A method for producing the LED filament according to claim 1, the method comprising:
providing the carrier with the two electrical terminals;
applying the adhesive layer on the carrier at least in two sections, wherein the adhesive layer comprises the first conversion material;
placing the radiation-emitting semiconductor chips directly onto the adhesive layer of the two sections, wherein the undersides of the semiconductor chips are directly connected by the adhesive layer to the carrier;
connecting the semiconductor chips by way of electrical lines to the electrical terminals; and
applying the matrix material comprising the second conversion material to the semiconductor chips, wherein the second conversion material is deposited on the upper sides and the lateral areas of the semiconductor chips forming the conversion layers, and wherein the matrix material is transparent to the electromagnetic radiation.

8. The method according to claim 7, wherein the carrier is composed of a molding material, and wherein the carrier is molded onto the electrical terminals.

9. The method according to claim 8, wherein the electrical terminals are constituents of a leadframe, wherein the carrier made of the molding material is molded onto the constituents, and wherein the constituents are then separated from the leadframe.

10. The method according to claim 9, wherein, before separating the constituents from the leadframe, checking functionalities of the semiconductor chips interconnected between the electrical terminals, and separating only the electrical terminals of viable arrangements of semiconductor chips from the leadframe.

11. The LED filament of claim 1, wherein the partition extends from the basal area less in the y-direction than the side walls of the carrier.

12. The LED filament of claim 1, wherein the receptacle regions are at least partly filled with the transparent matrix material mixed with the second conversion material up to a predetermined height along the y-direction.

13. An LED filament comprising:
a carrier composed of a material transparent to electromagnetic radiation;
two electrical terminals on the carrier; and
at least two radiation-emitting semiconductor chips arranged on the carrier,
wherein the semiconductor chips are connected in electrically conductive manner to the electrical terminals,
wherein the carrier comprises a receptacle space, the receptacle space being delimited by a basal area of the carrier, by a first side wall and a second opposite side wall of the carrier and by a third sidewall and a fourth opposite side wall of the carrier and by, wherein the side walls extend from the basal area in a y-direction,
wherein a basal region of the carrier comprises a partition, the partition extending from the basal area of the carrier in the y-direction, wherein the partition extends from the first side wall to the second side wall of the carrier along a z-direction, wherein the partition divides the receptacle space along a x-axis in two receptacle regions, and wherein at least one of the semiconductor chips is arranged on the basal area of the carrier in each receptacle region,
wherein undersides of the semiconductor chips are connected by way of an adhesive layer to the basal area of the carrier,
wherein the adhesive layers comprise a first conversion material,
wherein the first conversion material is configured to shift at least a portion of a wavelength of a radiation from the semiconductor chip,
wherein the semiconductor chips comprise a conversion layer on upper sides and on lateral areas, and
wherein the conversion layers are configured to shift at least a portion of the wavelength of the radiation from the semiconductor chips.

14. The LED filament of claim 13, wherein the partition extends less in the y-direction than the side walls of the carrier.

15. The LED filament according to claim 14, wherein partition terminates along the y-direction above the upper sides of the semiconductor chips.

16. The LED filament according to claim 13, wherein the lateral areas of the receptacle regions incline outwardly.

17. A method for producing an LED filament, wherein the LED filament comprises a carrier composed of a material transparent to electromagnetic radiation, two electrical terminals located on the carrier and at least two radiation-emitting semiconductor chips arranged on the carrier, wherein the semiconductor chips are connected in electrically conductive manner to the electrical terminals, wherein undersides of the semiconductor chips are connected by way of an adhesive layer to the carrier, wherein the adhesive layers comprise a first conversion material, wherein the first conversion material is configured to shift at least a portion of a wavelength of radiation from the semiconductor chips, wherein the semiconductor chips comprise conversion layers on upper sides and on lateral areas, wherein the conversion layers are configured to shift at least a portion of the wavelength of the radiation from the semiconductor chips, wherein a transparent matrix material mixed with a second conversion material covers the semiconductor chips, and wherein sedimented conversion layers with an increased concentration of the second conversion material cover the upper sides and the lateral areas of the semiconductor chips, the method comprising:
- providing the carrier with the two electrical terminals;
- applying the adhesive layer on the carrier at least in two sections, wherein the adhesive layer comprises the first conversion material;
- placing the radiation-emitting semiconductor chips onto the adhesive layer of the two sections, wherein the undersides of the semiconductor chips are connected by the adhesive layer to the carrier;
- connecting the semiconductor chips by way of electrical lines to the electrical terminals; and
- applying the matrix material comprising the second conversion material to the semiconductor chips, wherein the second conversion material is deposited on the upper sides and the lateral areas of the semiconductor chips forming the conversion layer, and wherein the matrix material is transparent to the electromagnetic radiation, wherein the carrier is composed of a molding material, wherein the carrier is molded onto the electrical terminals, wherein the electrical terminals are constituents of a leadframe, wherein the carrier made of the molding material is molded onto the constituents, wherein the constituents are then separated from the leadframe, wherein, before separating the constituents from the leadframe, checking functionalities of the semiconductor chips interconnected between the electrical terminals, and separating only the electrical terminals of viable arrangements of semiconductor chips from the leadframe.

\* \* \* \* \*